United States Patent
Kim et al.

(10) Patent No.: US 9,466,589 B2
(45) Date of Patent: Oct. 11, 2016

(54) POWER MODULE PACKAGE INCLUDING HEAT SPREADER AND INDUCTANCE COIL

(71) Applicant: SAMSUNG ELECTRO-MECHANICS CO., LTD., Suwon-Si, Gyeonggi-Do (KR)

(72) Inventors: Kwang Soo Kim, Suwon-Si (KR); Young Hoon Kwak, Suwon-Si (KR); Chang Seob Hong, Suwon-Si (KR); Joon Seok Chae, Suwon-Si (KR); Kee Ju Um, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/661,844

(22) Filed: Mar. 18, 2015

(65) Prior Publication Data
US 2015/0270217 A1    Sep. 24, 2015

(30) Foreign Application Priority Data

Mar. 18, 2014 (KR) .................. 10-2014-0031810

(51) Int. Cl.
| | | |
|---|---|---|
| H01L 23/522 | (2006.01) | |
| H01L 25/065 | (2006.01) | |
| H01L 23/367 | (2006.01) | |
| H01L 23/36 | (2006.01) | |
| H01L 23/373 | (2006.01) | |
| H01L 23/552 | (2006.01) | |

(52) U.S. Cl.
CPC ........... H01L 25/0655 (2013.01); H01L 23/36 (2013.01); H01L 23/3735 (2013.01); H01L 23/552 (2013.01); *H01L 2224/48091* (2013.01); *H01L 2224/49111* (2013.01)

(58) Field of Classification Search
CPC ........... H01L 23/3735; H01L 23/4985; H01L 2224/48091; H01L 2924/13055; H01L 2924/19105; H01L 2224/45139; H01L 23/467; H01L 23/473; H01L 2924/1305; H01L 2224/48227; H01L 2924/00014; H01L 2924/00
USPC ........ 257/690–693, 696, 698, 712–722, 784, 257/786
See application file for complete search history.

(56) References Cited

U.S. PATENT DOCUMENTS

| | | |
|---|---|---|
| 7,723,129 B2 | 5/2010 | Koduri |
| 8,649,179 B2 | 2/2014 | Hershberger et al. |

(Continued)

FOREIGN PATENT DOCUMENTS

| | | |
|---|---|---|
| JP | 07-201574 A | 8/1995 |
| JP | 2009-253643 A | 10/2009 |
| KR | 10-2013-0122786 A | 11/2013 |

OTHER PUBLICATIONS

Korean Office Action dated Jul. 16, 2015 issued in Korean Patent Application No. 10-2014-0031810 (English translation).

*Primary Examiner* — Alexander Oscar Williams
(74) *Attorney, Agent, or Firm* — McDermott Will & Emery LLP

(57) ABSTRACT

There is provided a power module package. The power module package includes: a base substrate provided with a pattern; a heat spreader formed by being stacked on an upper surface of the base substrate; and at least one first semiconductor device mounted on an upper surface of the heat spreader, wherein an outer circumferential surface of the heat spreader is provided with a coil.

17 Claims, 4 Drawing Sheets

(56) References Cited

U.S. PATENT DOCUMENTS

| | | | | |
|---|---|---|---|---|
| 2012/0193071 A1* | 8/2012 | Tsunekawa | H01L 21/67109 | 165/61 |
| 2013/0221513 A1 | 8/2013 | Borghoff | | |
| 2013/0270687 A1* | 10/2013 | Kim | H01L 23/3735 | 257/690 |
| 2014/0003013 A1* | 1/2014 | Yoo | H01L 25/072 | 361/767 |
| 2014/0117524 A1* | 5/2014 | Kim | H01L 23/4334 | 257/676 |
| 2014/0118956 A1* | 5/2014 | Kim | H01L 23/049 | 361/728 |
| 2014/0167237 A1* | 6/2014 | Yoo | H01L 24/73 | 257/676 |
| 2014/0167242 A1* | 6/2014 | Kim | H01L 23/053 | 257/690 |
| 2014/0185242 A1* | 7/2014 | Kim | H01L 23/49861 | 361/707 |
| 2014/0218942 A1* | 8/2014 | Song | F21V 29/22 | 362/382 |
| 2015/0214126 A1* | 7/2015 | Kim | H01L 23/34 | 361/717 |

* cited by examiner

POWER MODULE PACKAGE INCLUDING HEAT SPREADER AND INDUCTANCE COIL

CROSS-REFERENCE TO RELATED APPLICATION

This application claims the benefit of Korean Patent Application No. 10-2014-0031810, filed on Mar. 18, 2014, entitled "Power Module Package" which is hereby incorporated by reference in its entirety into this application.

BACKGROUND

The present disclosure relates to a power module package.

With increase in energy consumption around the world, an efficient use of restricted energy has drawn much attention. Therefore, a use of an inverter adopting an intelligent power module (IPM) for efficient power conversion of energy in the existing home and industrial appliances has been accelerated. The intelligent power module (IPM) that has been prominent in accordance with the increase in the use of the inverter is a core component performing direct current (DC) rectification and alternate current (AC) conversion in the inverter and may be used in home appliances such as a refrigerator, a washing machine, an air conditioner, industrial applications such as an industrial motor, or the like, and the next generation applications such as a hybrid electric vehicle (HEV), or the like. With the expansion of the power module, a market demand for high capacitance/high efficiency/high reliability has been increased.

The intelligent power module is disclosed in U.S. Patent Laid-Open Publication No. "US2013-0221513". A disposition form of the intelligent power module (IPM) is extremely limited and only the limited number of intelligent power modules (IPMs) is connected to each other in parallel, due to a uniform control of each power semiconductor device, heat generation unbalance between the semiconductor devices, and the like.

In this case, in configuring a parallel connection circuit, generally, a snubber and an inductor unit (coil) configure a pair of circuits to configure a buffer circuit. The snubber is positioned inside the intelligent power module. However, a size of the inductor unit (coil) which induces a voltage is larger than the semiconductor device and thus the inductor unit needs to be formed in a separate space.

RELATED ART DOCUMENT

Patent Document (Patent Document 1) US2013-0221513 A1

SUMMARY

An aspect of the present disclosure may provide a power module package in which a mounting space of an inductor unit (coil) is not separately formed.

According to an aspect of the present disclosure, a power module package may include: a base substrate provided with a pattern; a heat spreader formed by being stacked on an upper surface of the base substrate; and at least one first semiconductor device mounted on an upper surface of the heat spreader, wherein an outer circumferential surface of the heat spreader is provided with a coil.

The plurality of first semiconductor devices may be formed to be electrically connected in parallel.

The power module package may further include: a second semiconductor device formed to be mounted on the upper surface of the base substrate while controlling a current and a voltage of the first semiconductor device.

The second semiconductor device may use relatively less power than the first semiconductor device.

The second semiconductor device may use a snubber switch for controlling a voltage supplied to the first semiconductor device.

A lower portion of the base substrate may be provided with a heat sink and a heat radiation plate which discharge heat.

The coil may be formed to be wound along the outer circumferential surface of the heat spreader.

The coil may have an outside provided with an insulator and may have an inside provided with a metal material.

According to another aspect of the present disclosure, a power module package may include: a base substrate provided with a pattern; a heat spreader formed on an upper surface of the base substrate and having a seating groove formed along an outer circumferential surface thereof; a coil formed to be inserted into the seating groove; and at least one first semiconductor device formed on an upper surface of the heat spreader.

The plurality of first semiconductor devices may be formed to be electrically connected in parallel.

The power module package may further include: a second semiconductor device formed to be mounted on the upper surface of the base substrate while controlling the first semiconductor device.

The second semiconductor device may use relatively less power than the first semiconductor device.

The second semiconductor device may use a snubber switch for controlling a voltage supplied to the first semiconductor device.

The coil may have an outside provided with an insulator and have an inside provided with a metal material.

An insulating layer may be formed between the seating groove and the coil.

A through groove may be formed to penetrate through one surface and the other surface of the heat spreader and input and output coils may be integrally connected through the through groove.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
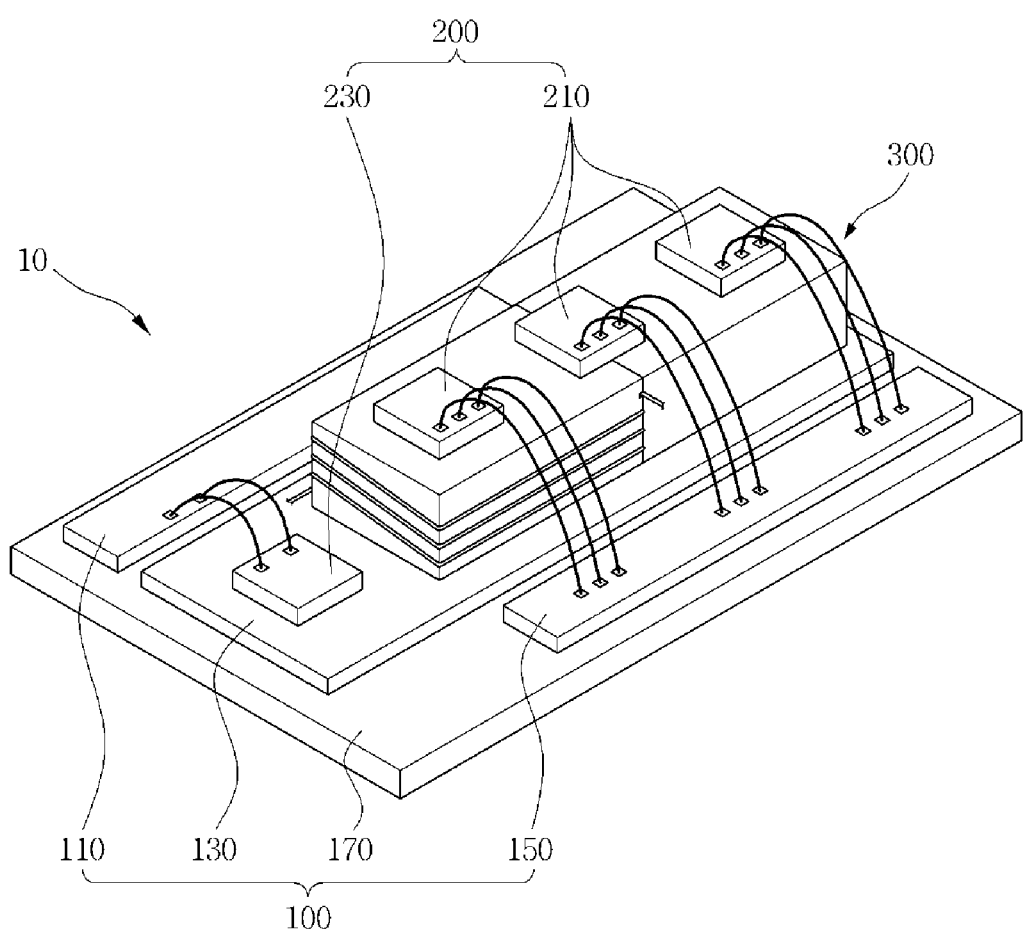
FIG. 1 is a perspective view illustrating a power module package according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

Figure 2:
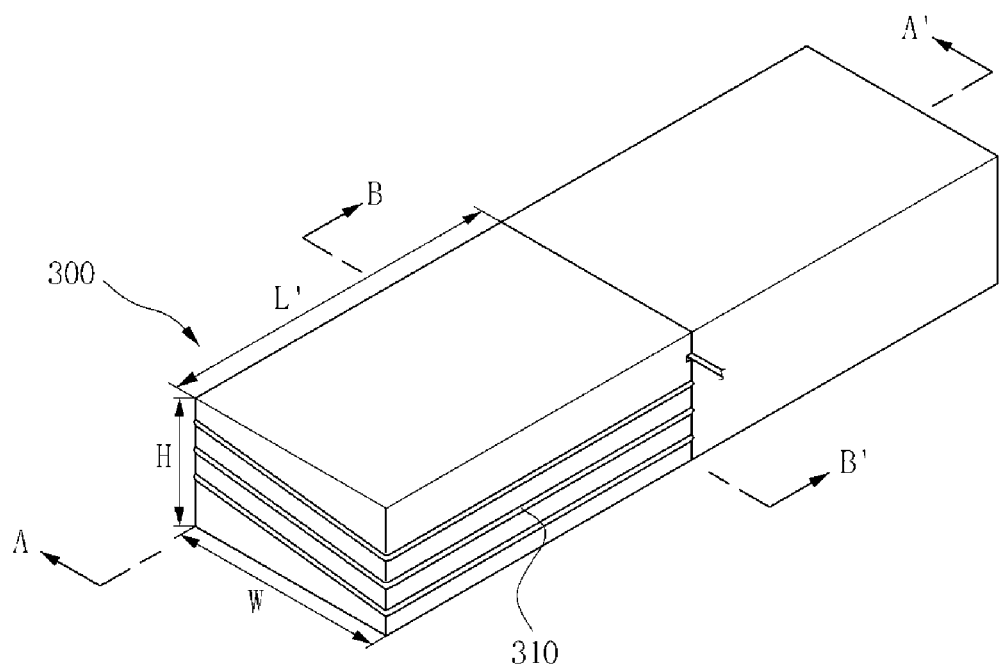
FIG. 2 is a perspective view of a heat spreader according to an exemplary embodiment of the present disclosure.
Figure 3:
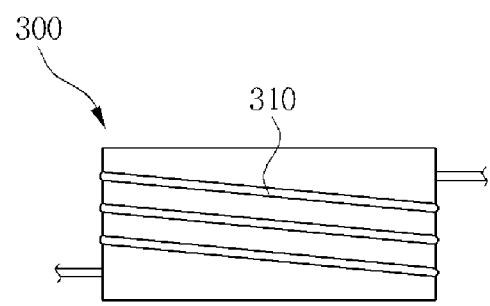
FIG. 3 is a side view of the heat spreader of FIG. 2.
Figure 4:
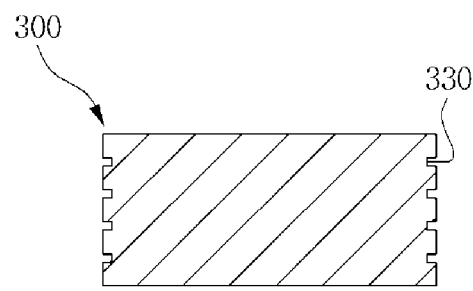
FIG. 4 is a cross-sectional view taken along the line A-A' of FIG. 2.
Figure 5:
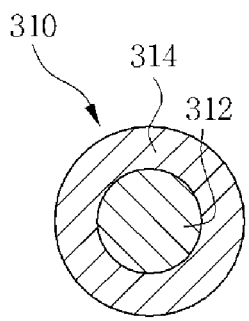
FIG. 5 is a cross-sectional view taken along the line B-B' of FIG. 2.
Figure 6:
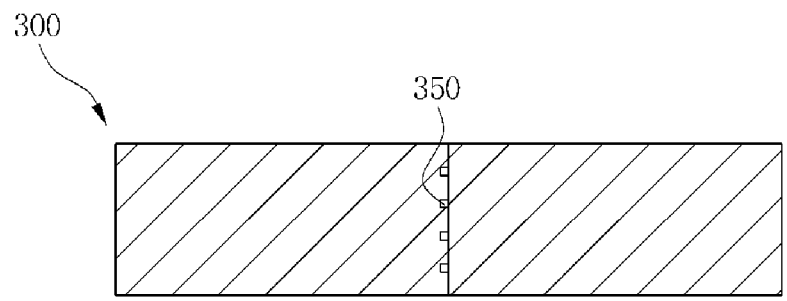
FIG. 6 is a cross-sectional view of a coil according to an exemplary embodiment of the present disclosure.
Figure 7:
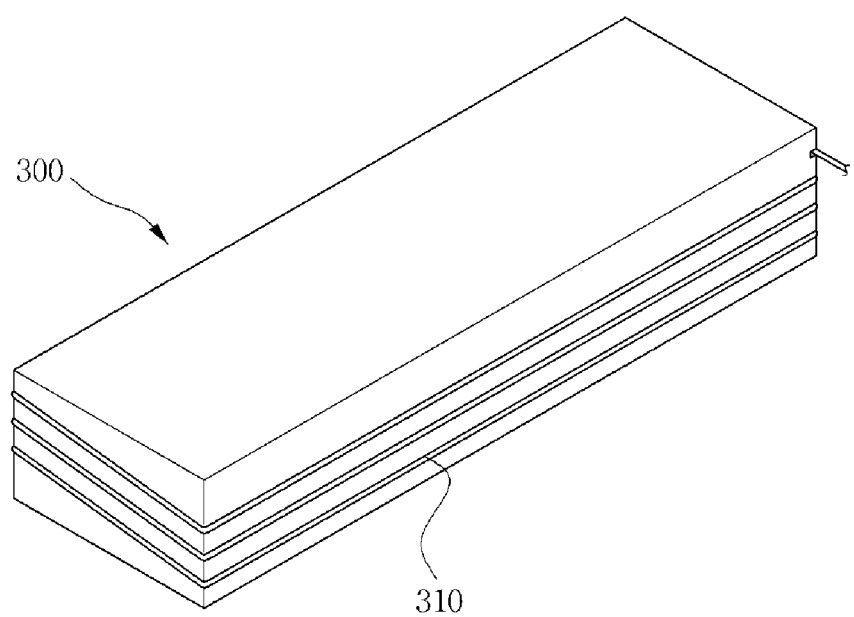
FIG. 7 is a perspective view of a heat spreader according to a second exemplary embodiment of the present disclosure.

FIG. 1 is a perspective view illustrating a power module package according to an exemplary embodiment of the present disclosure, FIG. 2 is a perspective view of a heat spreader according to an exemplary embodiment of the present disclosure, FIG. 3 is a side view of the heat spreader of FIG. 2, FIG. 4 is a cross-sectional view taken along the line A-A' of FIG. 2, FIG. 5 is a cross-sectional view taken along the line B-B' of FIG. 2, FIG. 6 is a cross-sectional view of a coil according to an exemplary embodiment of the present disclosure; and FIG. 7 is a perspective view of a heat spreader according to a second exemplary embodiment of the present disclosure.

A power module package 10 is formed to have a configuration in which at least one semiconductor device (power device) 200 including MOSFET, IGBT, FRD, and the like is connected to each other in parallel.

The power module package according to the exemplary embodiment of the present disclosure includes a base substrate 100 on which patterns are formed, a heat spreader 300 which is formed by being stacked on an upper surface of the base substrate 100, and at least one first semiconductor device 210 which is mounted on an upper surface of the heat spreader 300.

The base substrate 100 is provided with a first pattern 110, a second pattern 130, and a third pattern 150 which are spaced apart from one another. This is not to limit a form of the first pattern 110, the second pattern 130, and the third pattern 150. The first pattern 110, the second pattern 130, and the third pattern 150 may be electrically connected to the semiconductor device 200 or each may be separately connected thereto. In this case, when the first pattern 110, the second pattern 130, and the third pattern 150 are each connected to the semiconductor device 200, they may be preferably connected thereto by a wire bonding scheme. This does not limit the electrical connection or form of the base substrate 100 and any base substrate 100 and circuit board used in the art may be used.

The base substrate 100 may be a printed circuit board, a ceramic substrate, and a metal substrate having an anodizing layer, but is not particularly limited thereto. The base substrate 100 is a circuit board in which at least one layer of circuit including a connection pad is formed on an insulating layer 170 and may preferably be a printed circuit board. For convenience of explanation, a detailed configuration of an inner layer circuit pattern is omitted in the present drawings, but those skilled in the art uses the circuit board in which at least one layer of circuit pattern layer is formed on the insulating layer, as the base substrate.

The insulating layer 170 may be generally made of a composite polymer resin used as an interlayer insulating material. For example, the insulating layer may be made of prepreg, ajinomoto build up film (ABF), and an epoxy-based resin such as FR-4 and bismaleimide Triazine (BT). In addition, the insulating layer may have a form of a substrate or a film. However, according to the exemplary embodiment of the present disclosure, a material forming the insulating layer and a form of the insulating layer are not limited thereto.

A lower end of the base substrate 100 may also be provided with a heat sink or a heat radiation plate (not illustrated) which discharges heat to the outside. The base substrate 100 may also discharge heat generated from the heat spreader 300 to the outside through the heat sink or the heat radiation plate (not illustrated). In this case, the heat sink or the heat radiation plate may be made of a material such as metal and aluminum alloy which discharge heat to the outside.

The heat spreader 300 disperses the heat generated from the semiconductor device 200 and transfers the dispersed heat to the base substrate 100. The heat spreader 300 is formed on the upper surface of the base substrate 100. The heat spreader 300 is made of a metal material. The heat spreader 300 may be preferably made of metal materials such as copper, aluminum, and aluminum alloy having excellent heat conductivity.

The heat spreader 300 is generally formed to have an outside which is plated with materials having strong wear resistance and corrosion resistance such as chromium and nickel to prevent the metal material from corroding. The heat spreader 300 serves to cut off an electromagnetic wave (EMI) of the semiconductor device.

The heat spreader 300 may be preferably formed in a rectangular form to have width (W)*height (H)*length (L). The heat spreader 300 may be changed to have various shapes such as an oval, a square, and a trapezoid. The heat spreader 300 may be preferably formed to have a coil 310 integrally wound along the outer circumferential surface thereof. The heat spreader 300 may be variously changed by a winding scheme of the coil 310.

The heat spreader 300 includes a seating groove 330 in which the coil 310 is seated and fixed and a through groove 350 through which the coil 310 is connected to the other surface thereof so that the coil 310 is integrally wound. The heat spreader 300 has the seating groove 330 formed along a portion of the outer circumferential surface thereof. In this case, a middle portion of the heat spreader 300 is provided with the through groove.

The seating groove 330 is formed to have the coil 310 fixedly inserted thereinto. A contact portion between the seating groove 330 and the coil 310 is formed to be insulated. The seating groove 330 is formed to have the coil 310 wound therearound. In this case, the seating groove 330 is preferably formed in a thread form so that the coil 310 is integrally wound therearound (see FIGS. 3 and 4). An inside of the seating groove 330 and the through groove 350 may also be formed with a protrusion (not illustrated) for fixing the coil 310.

The through groove 350 is formed so that the coil 310 may be integrally wound only around one section of the heat spreader 300 (see FIG. 6). The through groove 350 is formed to penetrate through from one surface of the heat spreader 300 to the other surface. The inside of the through groove 350 is fixedly inserted with the coil 310.

The coil 310 is formed to contact the outer circumferential surface of the surface of the heat spreader 300. In this case, to prevent the outer circumferential surface of the coil 310 from being electrical short-circuited, the outer circumferential surface of the coil 310 is provided with an insulating material 314 and the inside thereof is preferably provided with a metal material 312. This is to prevent the electrical short circuit with the heat spreader 300.

Further, the coil 310 may use an adhesive when the surface of the heat spreader 300 is wound. In this case, as the adhesive, a material which is not melted by a heat dispersion of the heat spreader 300 is used.

The coil 310 has the following Relationship Equation 1 depending on the voltage capacitance of the power module package 10. The coil 310 is appropriately controlled depending on a set value of preset inductance depending on the Relationship Equation of a turn number N of the coil wound around heat spreader, an area (A=W*L') of the coil wound around the heat spreader, the height (H) of the heat spreader, and a coefficient H of a material of the heat spreader.

$$L = \frac{N^2 \times (W \times L') \times \mu}{H}$$ [Relationship Equation 1]

The semiconductor device 200 may include various devices such as a passive device and an active device. The semiconductor device 200 includes a first semiconductor device 210 and a second semiconductor device 230. The first semiconductor device 210 and the second semiconductor device 230 may be used as at least one of a power device and a control device. This is an exemplary embodiment and is not to limit a kind of the semiconductor device 200 which is mounted in the power module package 10.

At least one first semiconductor device 210 is formed on the upper surface of the heat spreader 300. In this case, the first semiconductor devices 210 are formed to be electrically connected to each other in parallel. As the first semiconductor device 210, any one of an insulated gate bipolar transistor (IGBT), a MOSFET, an FRD, a diode, and the like which are a power device series is appropriately used.

The second semiconductor device 230 uses a control integrated circuit (IC) which is a control device series. The second semiconductor device 230 prevents a current flowing in the device from being suddenly changed. The second semiconductor device 230 is formed to be mounted on the upper surface of the base substrate 100 and is formed to use the control device. The second semiconductor device 230 uses less power than the first semiconductor device 210. This is to prevent the voltage and current of the first semiconductor device 210 from being suddenly changed.

The second semiconductor device 230 controls a current and a voltage supplied from the outside. The second semiconductor device 230 serves to absorb a surge voltage or a ringing voltage. In this case, as the second semiconductor device 230, the snubber may be appropriately used. This is not to limit the second semiconductor device 230 to the snubber. The inside of the power module package 10 may be mounted with a plurality of semiconductor devices 200. The second semiconductor device 230 may be integrally formed with the coil 310 to improve the electrical reliability of products. Further, the outer circumferential surface of the heat spreader is provided with inductor unit (coil) to obtain additional effects such as the reduction in overall size and the reduction in impedance in addition to the improvement in heat radiation property, and the like.

In a power module package according to a second exemplary embodiment of the present disclosure described with reference to FIG. 7, the description of the same components as the foregoing one exemplary embodiment will be omitted and a structure of a heat spreader 300 according to the second exemplary embodiment of the present disclosure will be described in detail.

The heat spreader 300 has the seating groove 330 formed along the overall outer circumferential surface thereof. The seating groove 330 is formed to have the coil 310 fixedly inserted thereinto. A contact portion between the seating groove 330 and the coil 310 is formed to be insulated. The seating groove 330 is formed to have the coil 310 wound therearound. In this case, the seating groove 330 is preferably formed in a thread form so that the coil is integrally wound therearound. The inside of the seating groove 330 may be provided with a protrusion for fixing the coil 310. Further, the existing heat spreader may be formed to seamlessly contact one side.

In a power module package according to a third exemplary embodiment of the present disclosure, the same components as the foregoing one exemplary embodiment will be omitted and a bonding structure of the heat spreader 300 and the inductor unit (coil) according to the third exemplary embodiment of the present disclosure will be described in detail.

The coil 310 is formed to contact the outer circumferential surface of the surface of the heat spreader 300. In this case, to prevent the outer circumferential surface of the coil 310 from being electrically short-circuited, the outer circumferential surface of the coil 310 is preferably provided with the insulating layer. Further, the coil 310 may use an adhesive when the surface of the heat spreader 300 is wound. In this case, as the adhesive, a material which is not melted by a heat dispersion of the heat spreader 300 is used. Further, the existing heat spreader may be formed to seamlessly contact one side thereof.

As set forth above, according to the exemplary embodiments of the present disclosure, it is possible to configure the power module package in which the buffer circuit is integrally formed, by forming the inductor unit (coil) on the outer circumferential surface of the heat spreader.

Further, it is possible to provide the power module package in which the mounting space of the inductor unit (coil) formed at the outside and the circuit wiring are not separately used, by forming the inductor unit (coil) on the outer circumferential surface of the heat spreader.

Further, it is possible to provide the power module package which is more compact than the existing power module package in which the inductor and the buffer circuit are separately formed, by forming the inductor unit (coil) on the outer circumferential surface of the heat spreader.

Further, it is possible to provide the power module package in which the internal circuit is protected from the external impact, by forming the inductor unit (coil) on the outer circumferential surface of the heat spreader.

Further, it is possible to reduce the parasitic impedance occurring between the circuits, by forming the inductor unit (coil) on the outer circumferential surface of the heat spreader.

Further, it is possible to provide the power module package in which the circuits all may be mounted inside the package, by forming the inductor unit (coil) on the outer circumferential surface of the heat spreader.

Further, it is possible to reduce the parasitic impedance occurring between the circuits to secure the reliability of products, by forming the inductor unit (coil) on the outer circumferential surface of the heat spreader.

Further, it is possible to reduce the parasitic impedance occurring between the circuits to increase the efficiency of products, by forming the inductor unit (coil) on the outer circumferential surface of the heat spreader.

Further, it is possible to provide the power module package in which the parasitic impedance occurring between the circuits is reduced and the defect due to the external impact is minimized, by forming the inductor unit (coil) on the outer circumferential surface of the heat spreader.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A power module package, comprising:
   a base substrate provided with a pattern;
   a heat spreader formed by being stacked on an upper surface of the base substrate; and
   at least one first semiconductor device mounted on an upper surface of the heat spreader,
   wherein an outer circumferential surface of the heat spreader is provided with a coil, and
   wherein the coil has inductance.

2. The power module package of claim 1, further comprising a plurality of first semiconductor devices,
   wherein the plurality of first semiconductor devices are formed to be electrically connected in parallel.

3. The power module package of claim 1, further comprising:
   a second semiconductor device formed to be mounted on the upper surface of the base substrate while controlling a current and a voltage of the first semiconductor device.

4. The power module package of claim 3, wherein the second semiconductor device uses relatively less power than the first semiconductor device.

5. The power module package of claim 3, wherein the second semiconductor device uses a snubber switch for controlling a voltage supplied to the first semiconductor device.

6. The power module package of claim 1, wherein a lower portion of the base substrate is provided with a heat sink and a heat radiation plate which discharge heat.

7. The power module package of claim 1, wherein the coil is formed to be wound along the outer circumferential surface of the heat spreader.

8. The power module package of claim 7, wherein the coil has an outside provided with an insulator and has an inside provided with a metal material.

9. A power module package, comprising:
   a base substrate provided with a pattern;
   a heat spreader formed on an upper surface of the base substrate and having a seating groove formed along an outer circumferential surface thereof;
   a coil formed to be inserted into the seating groove; and
   at least one first semiconductor device formed on an upper surface of the heat spreader.

10. The power module package of claim 9, further comprising a plurality of first semiconductor devices,
    wherein the plurality of first semiconductor devices are formed to be electrically connected in parallel.

11. The power module package of claim 9, further comprising:
    a second semiconductor device formed to be mounted on the upper surface of the base substrate while controlling the first semiconductor device.

12. The power module package of claim 11 wherein the second semiconductor device uses relatively less power than the first semiconductor device.

13. The power module package of claim 11, wherein the second semiconductor device uses a snubber switch for controlling a voltage supplied to the first semiconductor device.

14. The power module package of claim 9, wherein the coil has an outside provided with an insulator and has an inside provided with a metal material.

15. The power module package of claim 9, wherein an insulating layer is formed between the seating groove and the coil.

16. The power module package of claim 9, wherein a through groove is formed to penetrate through one surface and the other surface of the heat spreader, and
    input and output coils are integrally connected through the through groove.

17. The power module package of claim 9, wherein the coil has inductance.

* * * * *